United States Patent

Fujii et al.

[11] Patent Number: 4,708,545
[45] Date of Patent: Nov. 24, 1987

[54] METHOD FOR DRILLING REFERENCE HOLES IN MULTI-LAYER PRINTED WIRING BOARD ASSEMBLY

[75] Inventors: Toshinori Fujii, Sakai; Shinji Okamoto, Yawata, both of Japan

[73] Assignee: Matsushita Electric Works, Ltd., Osaka, Japan

[21] Appl. No.: 797,983

[22] Filed: Nov. 14, 1985

[30] Foreign Application Priority Data

Nov. 26, 1984 [JP] Japan ................................ 59-249203

[51] Int. Cl.$^4$ ............................................... B23C 3/00
[52] U.S. Cl. .................................... 409/131; 408/1 R
[58] Field of Search .................. 408/1 R, 3, 8, 13, 15, 408/16; 29/593; 324/73 PC; 409/131, 132

[56] References Cited

U.S. PATENT DOCUMENTS

| | | | |
|---|---|---|---|
| 4,432,037 | 2/1984 | Brabetz | 361/410 |
| 4,485,964 | 12/1984 | Yamada et al. | 408/3 |
| 4,536,239 | 8/1985 | Benson | 156/64 |

FOREIGN PATENT DOCUMENTS

| | | | |
|---|---|---|---|
| 137543 | 8/1983 | Japan | 408/8 |
| 53109 | 3/1984 | Japan | 408/16 |
| 53110 | 3/1984 | Japan | 408/16 |

Primary Examiner—Z. R. Bilinsky
Attorney, Agent, or Firm—Burns, Doane, Swecker & Mathis

[57] ABSTRACT

A method for drilling reference holes in a multi-layer printed wiring board assembly, in which drilling position marks provided on inner-layer circuit board in the assembly are roughly detected through each of two outer-layer boards of the assembly, a spot-facing is made with respect to the outer-layer boards at roughly detected points of the marks, and thereafter the marks are precisely detected at the faced spots. Positions for drilling the reference holes can be thereby determined at the spots precisely in close proximity to the internally provided drilling position marks, to allow the drilling performed very accurately in simpler and economical manner.

7 Claims, 10 Drawing Figures

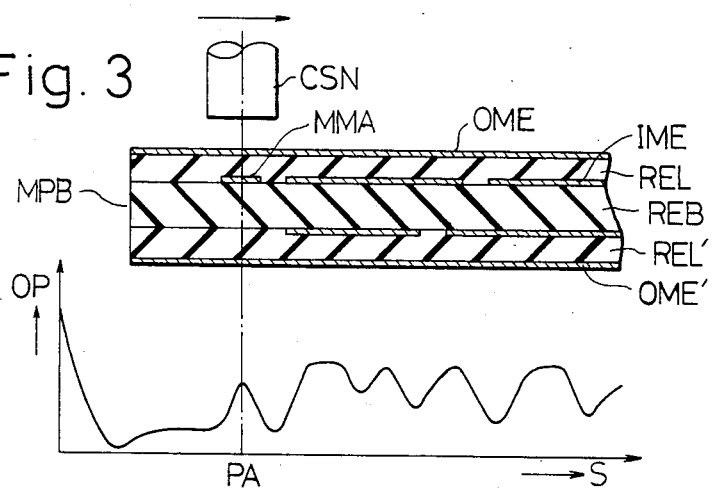
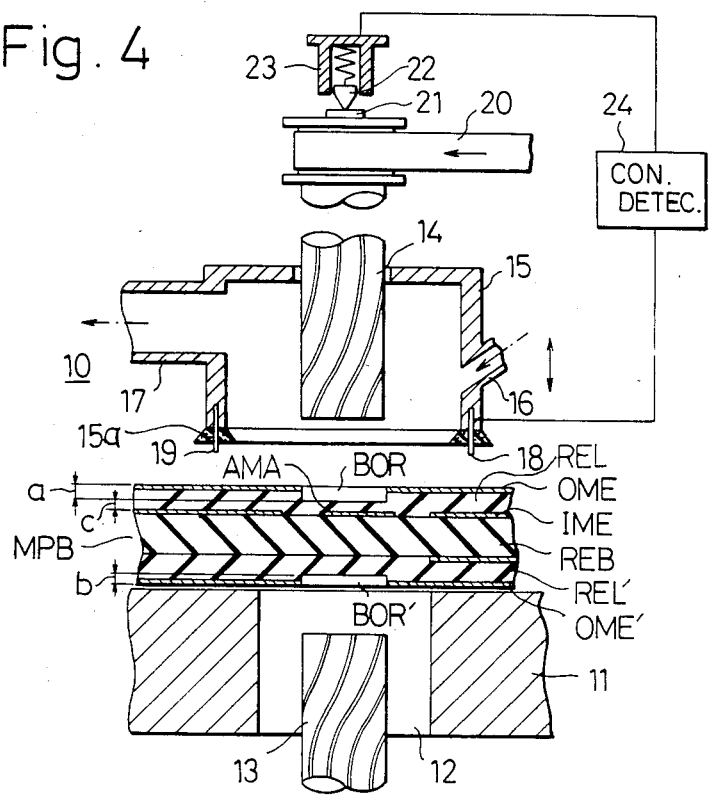

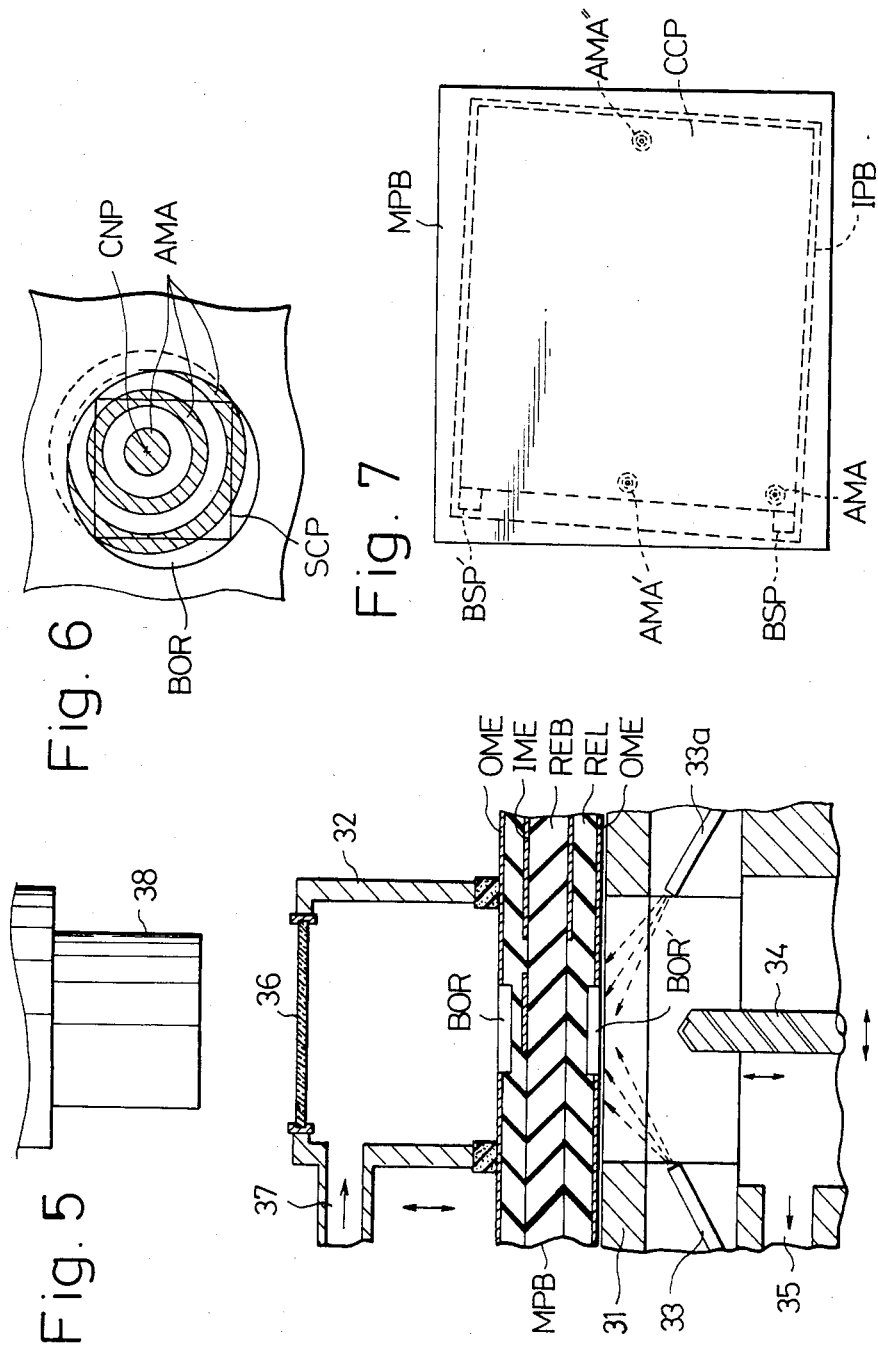

METHOD FOR DRILLING REFERENCE HOLES IN MULTI-LAYER PRINTED WIRING BOARD ASSEMBLY

TECHNICAL BACKGROUND OF THE INVENTION

This invention relates to methods for drilling reference holes in a multi-layer printed wiring board assembly and, more particularly, to a reference-hole drilling method in which internally provided position marks for drilling the reference holes through the assembly are initially roughly detected, the assembly is spot-faced at the roughly detected position for more accurate detection of the marks, and the holes are made at thus accurately detected points.

The reference-hole drilling methods of the kind referred to are utilized effectively in making holes through the multi-layer printed wiring board assembly to be employed as reference holes for providing the outermost circuit layer optimumly with respect to inner-layer circuits of a metallic foil between respective laminated resin boards of the multi-layer printed wiring board.

DISCLOSURE OF PRIOR ART

In general, the multi-layer printed wiring board assembly for use in electronic apparatuses or the like is fabricated by forming the inner-layer circuit boards with the metallic foils joined to one or both surfaces of the respective resin boards, stacking the inner-layer circuit boards into a laminate, placing outer-layer resin boards on upper and lower surfaces of the laminate, forming the outer-layer circuit of the metallic foil on each of the outer-layer resin boards, and subjecting the laminate to a hot-press molding to join the inner and outer layer circuit boards into the assembly.

During such fabrication of the multi-layer printed wiring board assembly, it is necessary to achieve an accurate alignment between the inner and outer layer circuit boards to avoid any distortion in their electrical characteristics. To this end, R. F. Benson has suggested in his U.S. patent application No. 514,624 to obtain a multi-layer printed wiring board assembly by providing a target pattern on each of inner and outer layer circuit boards, and aligning these target patterns with each other while observing them through the boards by means of a radioactive ray. According to Benson, it is possible to accurately align the inner and outer layer circuits with each other by bringing the respective target patterns positionally in conformity to each other, but it has been defective in the necessity of providing a safety measure against the radioactive ray which involving costly facilities therefor.

In U.S. Pat. No. 4,432,037, on the other hand, B. Brabetz has suggested a relatively economical measure for making terminal holes for metallic-through connections in the multi-layer printed circuit board assembly, in which a conductive test pattern is provided adjacent circuit part of the inner-layer circuit board, bores are made through the assembly by means of a metal drill acting as an electrical probe while detecting contacts of the drill with the test pattern in repetitively making the bores at different positions to measure any positional deviation between the inner-layer circuits, and a position for the terminal hole is calculated out of the deviational measurements. However, Brabetz still involves a certain extent of complicacy and difficulty in determining the hole drilling position higly precisely.

TECHNICAL FIELD OF THE INVENTION

A primary object of the present invention is, therefore, to provide a method for drilling reference holes in the multi-layer printed wiring board assembly, which allows the reference holes to be made at a high precision for accurately forming the outer-layer circuit boards with respect to the inner-layer circuit boards of the assembly, without requiring any expensive facilities of the safety measure, and yet in a manner reliably safe and simple.

According to the present invention, this object can be realized by providing a method for drilling reference holes used for forming outer-layer circuit in the multi-layer printed wiring board assembly, which method being generally achieved by providing drilling-position marks for the reference holes on an inner-layer circuit board, stacking an outer-layer board at least on an outer surface of at least one of the inner-layer circuit board, and drilling the reference holes through the stacked boards with respect to the drilling-position marks, wherein, specifically, the drilling-position marks are roughly detected from the exterior of the outer-layer circuit board, a spot-facing is made with respect to the outer-layer board at roughly detected spots of the marks, a precise detection of the marks is carried out at the face spots, and the reference holes are drilled at precisely detected points of the marks.

With such method as above, the present invention makes it possible to drill the reference holes at extremely highly precisely determined points therefor, because the spot-facing is performed at the roughly detected positions on the outer-layer board which are corresponding to the drilling position marks of the inner-layer circuit board so as to make a shallow bore in the outer-layer board at the roughly detected positions and the reference hole drilling point can be precisely determined sufficiently in close proximity to the drilling position mark of the inner-layer circuit board, prior to the reference hole drilling.

Other objects and advantages of the present invention shall become clear from the following description of the invention detailed with reference to preferred embodiments shown in accompanying drawings.

BRIEF EXPLANATION OF THE DRAWINGS

FIG. 3 is a diagram for explaining a practical example of detecting operation performed at the roughly position detecting step of FIG. 2;

FIG. 4 is a diagram for explaining a step of spot-facing in the method of the present invention;

FIG. 5 is a diagram for explaining a step of drilling the reference holes in the method of the present invention;

FIG. 6 is a diagram for explaining a step of precisely detecting the drilling point in the method of the present invention;

FIG. 7 is a top plan view of a printed wiring board including the inner-layer circuit board in another aspect for use in the method of the present invention;

Figure 1:
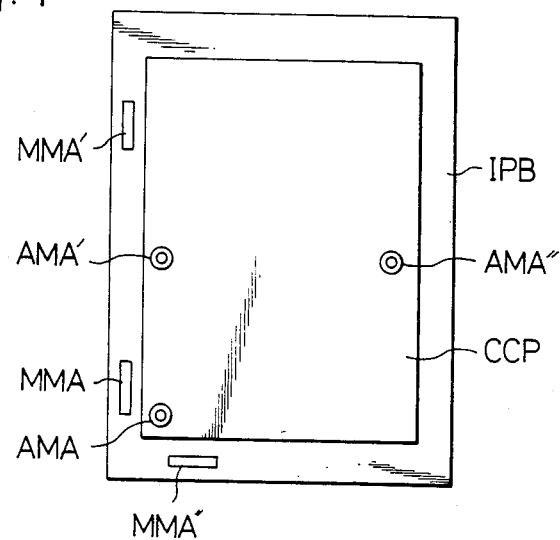
FIG. 1 is a top plan view in one aspect of an inner-layer circuit board used the method for drilling the reference holes in a multi-layer printed wiring board assembly according to the present invention.

While the present invention shall now be described with reference to the preferred embodiments shown in the drawings, it should be understood that the intention is not to limit the invention only to the particular embodiments shown but rather to cover all alterations, modifications and equivalent arrangements possible within the scope of appended claims.

DISCLOSURE OF PREFERRED EMBODIMENTS

Figure 2:
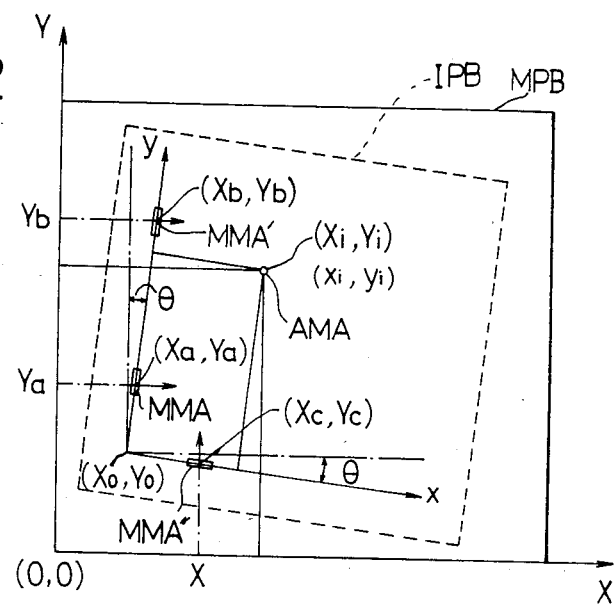
FIG. 2 is a diagram for explaining a step of roughly detecting the drilling position in the method of the present invention in which rough positioning marks are used therefor.

Referring to FIG. 1, there is shown an inner-layer printed circuit board IPB used in an embodiment of the method for drilling the reference holes in the multi-layer printed wiring board assembly according to the present invention, and this inner-layer printed circuit board IPB is provided, when a circuit pattern CCP is placed thereon in a known manner, with a plurality of drilling position marks AMA of, for example, metallic foil at proper positions in the circuit pattern CCP, and with a plurality of positioning marks MMA also of metallic material preferably in the form of foil and at such proper positions as, when the circuit pattern CCP is formed in an elongated rectangular shape, two separated positions in a longer side periphery and a single position in a shorter side periphery of the circuit board IPB as slightly spaced from the peripheral edge of the circuit pattern CCP. These positioning marks MMA are disposed as so related to the drilling position marks AMA as to be able to set the marks AMA in the X-Y coordinate system. More specifically, as shown in FIG. 2, the respective positioning marks MMA are arranged so that a straight line forming the Y-axis will pass through the centers of the both positioning marks MMA and MMA' provided on the longer side periphery of the pattern CCP and a straight line forming the X-axis normal to the Y-axis will pass through the center of the positioning mark MMA" on the shorter side periphery of the pattern CCP, and the coordinate positions of the drilling position marks AMA can be indexed in the X-Y coordinate system.

As will be clear from FIG. 3, the foregoing inner-layer circuit board IPB is prepared usually by forming on one surface of a resin board REB the circuit pattern CCP (if necessary, on both surfaces), drilling position marks AMA and positioning marks MMA with an electrically conductive inner-layer metal foil IME joined onto the surface or surfaces of the board REB, and a multi-layer printed wiring board assembly MPB is prepared by providing outer-layer resin boards REL and REL' on both surfaces of the inner-layer circuit board IPB or, as required, of a laminate of a plurality of the boards IPB, and joining outer-layer conductive metal foils OME and OME' onto both outer surfaces of the resin boards REL and REL'.

Here, an eddy current sensor CSN including a sensor coil and generating a high frequency magnetic field is provided for scanning over the multi-layer printed wiring board assembly MPB. As the sensor CSN scans sequentially downwardly or upwardly from an upper edge position Yb or a lower edge position Ya on the Y-axis and in the direction of the X-axis as shown in FIG. 2, a magnetic field induced by the sensor CSN will cause an eddy current loss to take place at the respective inner and outer layer metal foils IME and OME. In the multi-layer printed wiring board assembly MPB under such condition, the thus caused eddy current loss becomes larger at positions where the positioning mark MMA' or MMA and inner-layer metal foil or foils IME are present as disposed between the outer-layer metal foils OME and OME', than that at positions where only the outer-layer foils OME and OME' exist in the axial direction of the sensor CSN, so that the impedance of the sensor coil will be thereby caused to vary so as to increase an output OP of the sensor CSN. It will be readily appreciated from a graph in FIG. 3 that, when the positioning mark MMA lies on the scanning line of the sensor CSN during its shifting S, the output OP of the sensor CSN will become high at a time PA before the scanning line reaches an edge of the circuit pattern CCP, and thereby the position of the positioning mark MMA is made detectable. The scanning line by means of the eddy current sensor CSN is set on respective lines of Y=Ya, Y=Yb and X=Xc on the X-Y coordinates acting as end face reference of the wiring board assembly MPB, and the positioning marks MMA are formed in a narrow elongated shape, so that the scanning line and marks MMA can be reliably made to intercept each other even when there exists any slight positional deviation in the inner-layer circuit board or boards IPB.

Now, the outer peripheral edge faces are cut as roughly related to the periphery of the inner-layer circuit board IPB, two adjacent peripheral edge lines of the assembly are used as the X-Y coordinates, and positions of the three positioning marks MMA, MMA' and MMA" are detected as being (Xa,Ya), (Xb,Yb) and (Xc,Yc), respectively. Then, an angle $\theta$ between the x and y axes passing through the three positioning marks and the X and Y axes of the outer edge lines of the assembly can be obtained by the following equation (1):

$$\theta = \tan^{-1}(Xb - Xa/Yb - Ya) \qquad (1)$$

The origin $(X_o, Y_o)$ of the x-y coordinates of the inner-layer circuit board IPB in the X-Y coordinates may be obtained by such equations (2) and (3) as follows:

$$X_o = Xb \cos^2\theta - Yb \sin\theta \cos\theta + Xc \sin^2\theta + Yc \sin\theta \cos\theta \qquad (2)$$

$$Y_o = -Xb \sin\theta \cos\theta + Yb \sin^2\theta + Xc \sin\theta \cos\theta + Yc \cos^2\theta \qquad (3)$$

When one of the drilling position marks AMA is expressed as (xi,yi) in the x-y coordinates, their positions (Xi,Yi) in the X-Y coordinates may be obtained by the following equations (4) and (5):

$$Xi = X_o + xi \cos\theta + yi \sin\theta \qquad (4)$$

$$Yi = Y_o = xi \sin\theta + yi \sin\theta \qquad (5)$$

It should be appreciated that the drilling position mark AMA can be roughly detected by practicing these equations (1) to (5). Such operations may be processed by an arithmetic circuit in a computer so as to drive the x and y axes (not shown) of a spot-facing device 10 on which the multi-layer printed wiring board assembly MPB is mounted, the assembly MPB is shifted so as to index the drilling position mark AMA, and thus indexed spot is placed at a spot facing position of the device 10. In this case, the adjacent two intercepting peripheral edge lines of the assembly may be accurately finished upon the foregoing rough cutting, by employing the foregoing detection of the positioning marks, so as to precisely obtain the cutting positions.

A table 11 of the spot-facing device 10 has a through hole 12 within which a lower end mill 13 is disposed as opposed to the drilling position mark AMA on its lower side for making a shallow bore BOR' by the spot-facing in the lower surface of the assembly MPB, whereas an upper end mill 14 is disposed above the assembly as axially aligned with the axis of the lower end mill 13 for making also a shallow bore BOR by the spot-facing in the upper surface of the assembly MPB. Disposed above the assembly MPB is an air-tight chamber 15 which surrounds the lower part of the upper end mill 14, to be moved up and down by a suitable drive means so that, during the spot-facing by means of the upper end mill 14, the air-tight chamber 15 will be brought into air-tight contact with the upper surface of the assembly MPB. This air-tight chamber 15 is provided with air supply and discharge ports 16 and 17 to effectively discharge chips made during the spot-facing. Further, the chamber 15 is provided at its lower end edge with an air-tight sealing rubber member 15a, through which a pair of contact detection pins 18 and 19 are provided to extend downward.

The upper end mill 14 is axially rotated by a timing belt 20 and is connected at its top end to a rotor 21 with which a brush 22 held resiliently by a holder 23 is brought into contact, while the holder 23 is electrically connected to a contact detector 24 electrically coupled to the contact detection pins 18 and 19. With such an arrangement, prior to the spot-facing, the air-tight chamber 15 is moved down, the contact detection pins 18 and 19 come into contact with the outer-layer metal foil OME of the assembly MPB, and the foil OME and contact detector 24 are electrically connected to each other. At the moment when the upper end mill 14 lowered starts the spot-facing upon which the mill 14 has contacted the metal foil OME, both end signals of the contact detector 24 are connected to each other to provide an output of contact timing signal, and this signal is provided to a spot-facing controller so that the spot-facing will be performed on the basis of the contact timing signal for controllably facing the surface of the assembly to a predetermined depth "a", and the spot-facing is terminated upon the bore BOR of the depth "a" is obtained.

While the above explanation has been made only with reference to the spot-facing by means of the upper end mill 14, substantially the same arrangement (not shown) is employed also for the lower end mill 13 and the bore BOR' is made to a predetermined depth "b". The depth "a" of the bore BOR is so set that a distance "c" between the bottom surface of the upper bore BOR and the top surface of the drilling position mark AMA is in a range of about 0.1 and 0.3 mm, and the lower bore BOR' is preferably set to be about 0.1 mm deep in the illustrated case.

After the bores have been made in the outer-layer resin board REL at positions corresponding roughly to the drilling position marks AMA, the X-Y axes are driven to shift the assembly MPB to a drilling station for drilling a reference hole at a precisely detected point of each of the drilling position marks AMA. Referring to FIGS. 5 and 6, a reference-hole drilling means comprises a table 31 for mounting thereon the assembly MPB, and an air-tight chamber 32 disposed above the table 31 to be brought air-tightly into contact with the assembly MPB interposed between them. The table 31 holds therein a plurality of fiber light guides 33 and 33a (only two of which are shown in the drawing) for irradiating light to the lower bore BOR'. A drill 34 is provided inside the table 31 to be right below the bore BOR', and the table is also provided with an air discharge port 35 for removal of drilling chips. The air-tight chamber 32 is provided at its top with a transparent plate 36 which is permeable to light and at a side part with an air supply port 37. Disposed above the light-permeable plate 36 is an industrial television camera 38 for monitoring the top surface of the upper bore BOR through the plate 36.

When light is irradiated from the fiber light guides 33 and 33a to the lower bore BOR', the TV camera 38 can monitor in its visual field SCP (FIG. 6) the drilling position mark AMA through the light permeable plate 36 and outer-layer resin board REL at the upper bore BOR. In the present instance, the drilling position mark AMA is formed in a pattern of, for example, coaxial triple circles of which the centrally positioned circle CNP denotes the exact drilling position, so that the position can be detected at an extremely high precision in the form of silhouette image with less influence of the inner and outer layer resin boards made effectively semitransparent by the spot-facing at the roughly detected position of the mark. Thus precisely detected information of the mark is processed preferably by means of a computer for driving a finely adjustable table (not shown) carrying a drill 34 to have the latter positioned right below the central circle CNP of the mark as highly precisely indexed. Then, the drill 34 is driven to be rotated and moved upward, a reference hole is thereby made highly accurately at the position of the mark in the multi-layer printed wiring board assembly MPB, and an outer-layer printed circuit can be formed with the outer-layer metal foil OME accurately on the base of the reference hole. After the drilling, air is fed through the port 37 so that any drilling chips can be discharged through the drilled reference hole and discharge port 35 to the exterior.

In the foregoing reference hole drilling method, the positioning marks MMA may not be necessarily disposed on the x and y axes but rather the x-y coordinates may be provided freely settable. Instead of shifting the drill 34 by means of the finely adjustable X-Y table, further, the multi-layer printed wiring board assembly MPB itself may be shifted as finely adjusted. The spot-facing depths "a" and "b" should suitably be selected in accordance with laminating state of the assembly specifically for the effective light permeation. The spot-facing performed with respect to the both surfaces of the assembly MPB solves such problem that a spot-facing only on one surface keeps the influence of the resin boards on the silhouette type detection to be large, and brings about an advantage that such influence can be made less upon the light irradiating detection for the highly precise detection of the drilling position marks.

Figure 8:
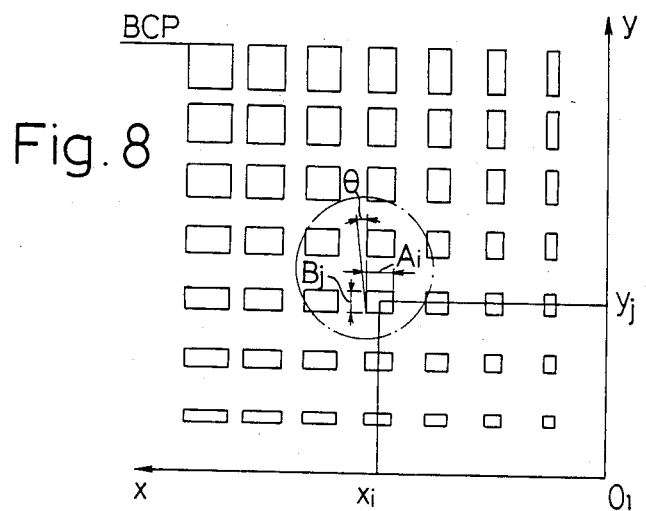
FIG. 8 is a diagram for explaining the rough position detecting step in the method of the present invention in which a bar scale is employed therefor with respect to the board of FIG. 7.

According to another feature of the present invention, the rough detection of the drilling position marks AMA can be realized in a different manner. Referring to FIGS. 7 and 8, the inner-layer printed circuit board IPB is provided with a pair of bar scale patterns BSP and BSP' along one side edge of the inner-layer circuit pattern CCP, the respective patterns being all formed simultaneously, and these bar scale patterns BSP are made to have an information of the x-y coordinate system. As shown in FIG. 8 in details, respective bars in the bar scale pattern BSP can represent, with their horizontal width Ai and vertical height Bj, x and y coordinates at the central point of the bar by such functions as $Ai=A(xi)$ and $Bj=B(yj)$, respectively, and the drilling position marks AMA, AMA' and AMA" are arranged as associated with each other in relation to such x and y coordinates xi and yj.

In indexing a drilling position on the basis of the bar scale pattern BSP, the spot-facing is carried out in such a circular contour as shown by a single-dot chain line in FIG. 8 in the vicinity of a bar having the information for the position, required positional information is obtained with the same light irradiating means employing the fiber light guide as in the foregoing embodiment with respect to the reference hole drilling position, and then the coordinates of the drilling position mark AMA are roughly detected on the basis of the positional information. The steps of performing the spot-facing with respect to the drilling position marks, precisely detecting the position, and drilling the reference hole are substantially the same as those disclosed with reference to FIGS. 1 to 4.

Figure 9:
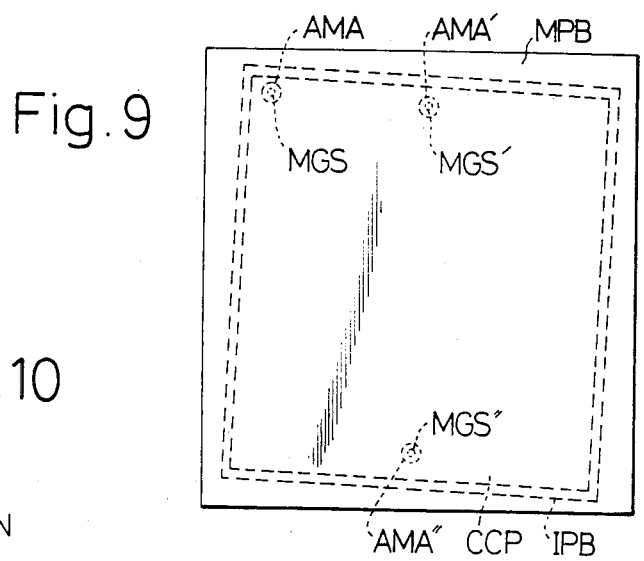
FIG. 9 is a top plan view of a printed wiring board including the inner-layer circuit board in still another aspect for use in the method of the present invention.
Figure 10:
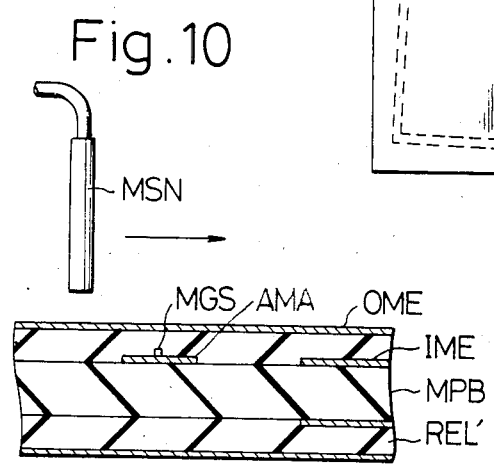
FIG. 10 is a diagram for explaining the rough position detecting step in the method of the present invention in which a magnetic member is used therefor with respect to the board of FIG. 9.

According to still another feature of the present invention, the rough detection of the drilling position marks AMA is carried out in a further different manner. Referring to FIGS. 9 and 10, the drilling position marks AMA, AMA' and AMA" formed in an inner-layer printed circuit board IPB employed here are respectively provided with each of chip-shaped magnetic members MGS, MGS' and MGS" directly joined onto the drilling position marks AMA. With respect to this inner-layer board IPB, instead of the eddy current sensor of FIG. 3, a magnetic sensor MSN is utilized for roughly detecting the drilling position marks directly, that is, without employing any arithmetic means. Since the magnetic members MGS are used only for the rough detection, further, it is unnecessary to position such materials MGS accurately at the center of the respective drilling position marks, but may even be located at any other position so long as their relative position to the drilling position marks can be arithmetically obtained. Since the electrically conductive foil is non-magnetic, the foil gives no influence on the rough detection by means of the magnetic sensor. The steps of carrying out the spot-facing with respect to the drilling position marks, precisely detecting the marks and drilling the reference holes are substantially the same as those set forth with reference to FIGS. 1 to 4.

The present invention may be modified in various ways. For example, the light irradiating means for the rough detection has been set forth as being provided on the side of the lower bore and the silhouette monitoring has been made on the side of the upper bore, but they may be reversed. While the industrial TV camera has been referred to for monitoring the drilling position marks, any other proper image pickup means such as an image sensor may take the place thereof.

What is claimed as our invention is:

1. A method for drilling reference holes in a multi-layer printed wiring board assembly having an inner-layer circuit board with a circuit pattern thereon, and an outer-layer board, comprising the steps of:
   providing drilling position marks for said reference holes on said inner-layer circuit board,
   providing positioning marks made of a conductive foil at prescribed related positions to said drilling position marks and in the vicinity of said circuit pattern of said inner-layer circuit board,
   stacking said outer-layer board on an outer surface of at least one side of said inner-layer circuit board,
   detceting said positioning marks by scanning said wiring board assembly, with an eddy current sensor mounted exteriorly of said outer-layer board, in predetermined directions and sensing any variation in eddy current loss,
   roughly estimating the locations of said drilling position marks on the basis of said detected positioning marks and spot-facing the outer surface of the outer-layer board at said locations,
   precisely detecting one of said drilling position marks at one of said spot-faced locations by irradiating light onto said spot-faced location on one side of said assembly, monitoring a lighted image of said drilling position mark at said spot-faced location on the other side of said assembly, and indexing the center of said drilling position mark in said monitored image thereof, and
   drilling reference holes through the stacked boards at said drilling position marks.

2. A method according to claim 1, wherein said detection of said positioning marks is carried out by detecting the displacement and slope of two-dimensional x-y coordinates set for said inner-layer circuit board in a predetermined relative positional relation to the positioning marks with respect to two-dimensional X-Y coordinates set for said outer-layer board, and said rough estimation of said drilling position marks is carried out by indexing them with said detected displacement and slope used as parameters.

3. A method according to claim 1, wherein said detection of said positioning marks is carried out by mounting said assembly onto a two-dimensional X-Y table, and shifting said table to place a spot of the assembly corresponding to the positioning mark at a position of said spot-facing.

4. A method according to claim 1, wherein said drilling of said reference hole is performed by means of a drill mounted to a movable table, said drill being positioned directly beneath said precisely detected drilling position mark by indexing said table.

5. A method according to claim 1, wherein said drilling of said reference hole is performed by mounting said assembly onto a movable table, and moving said table to have said precisely detected drilling position mark positioned directly above a drill provided below the table for drilling said reference holes.

6. A method according to claim 1, wherein said inner-layer circuit board is further provided with a pattern of bar scales denoting positional information of said drilling position marks, said pattern being located at a position related to said drilling position marks, and said rough estimation of the marks is carried out on the basis of said pattern.

7. A method according to claim 1, wherein said inner-layer circuit board is further provided with a magnetic member at a position related to said drilling position marks, and said rough detection of the marks is carried out by detecting said magnetic member with a magnetic sensor.

* * * * *